(12) United States Patent
Cheng (10) Patent No.: US 12,347,700 B2
(45) Date of Patent: Jul. 1, 2025

(54) WET BENCH AND CHEMICAL TREATMENT METHOD USING THE SAME

(71) Applicant: TAIWAN SEMICONDUCTOR MANUFACTURING CO., LTD., Hsinchu (TW)

(72) Inventor: Hsin-Chen Cheng, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 328 days.

(21) Appl. No.: 17/871,430

(22) Filed: Jul. 22, 2022

(65) Prior Publication Data

US 2022/0359238 A1 Nov. 10, 2022

Related U.S. Application Data

(62) Division of application No. 16/457,416, filed on Jun. 28, 2019, now Pat. No. 11,532,493.

(Continued)

(51) Int. Cl.
*H01L 21/67* (2006.01)
*B05D 1/18* (2006.01)
(Continued)

(52) U.S. Cl.
CPC .......... *H01L 21/67086* (2013.01); *B05D 1/18* (2013.01); *B08B 3/08* (2013.01); *H01L 21/306* (2013.01); *H01L 21/67057* (2013.01)

(58) Field of Classification Search
CPC ............ H01L 21/67086; H01L 21/306; H01L 21/67057; H01L 21/67011; B05D 1/18; B08B 3/08; Y02P 70/50
See application file for complete search history.

(56) References Cited

U.S. PATENT DOCUMENTS 4,967,777 A  11/1990  Takayama et al.
5,451,267 A   9/1995  Stadler et al.
(Continued)

FOREIGN PATENT DOCUMENTS

CN       1499179 A    5/2004
CN    201534157 U    7/2010
(Continued)

OTHER PUBLICATIONS

KR-100205543-B1, Machine Translation (Year: 2024).*
JP-7515335-B2, Machine Translation. (Year: 2024).*
JP H05102121 A, Machine Translation (Year: 2024).*

*Primary Examiner* — Duy Vu N Deo
*Assistant Examiner* — Christopher Remavege
(74) *Attorney, Agent, or Firm* — Maschoff Brennan (57) ABSTRACT

A method includes introducing a chemical liquid into the inner tank; reacting the wafer with the chemical liquid to generate byproducts; overfilling the inner tank with the chemical liquid and the byproducts from the inner tank to an outer tank, wherein the outer tank has an upper inclined bottom plate, a lower flat bottom plate, and a vertical intermediary bottom plate connecting the upper inclined bottom plate to the lower flat bottom plate, the inner tank penetrates through the upper inclined bottom plate of the outer tank; introducing the chemical liquid with the byproducts from above the lower flat bottom plate of the outer tank to a filter; filtering out the byproducts out of the chemical liquid by using the filter; introducing the filtered chemical liquid to the inner tank.

20 Claims, 4 Drawing Sheets

Related U.S. Application Data (60) Provisional application No. 62/712,207, filed on Jul. 30, 2018.

(51) Int. Cl.
  *B08B 3/08* (2006.01)
  *H01L 21/306* (2006.01)

(56) References Cited

U.S. PATENT DOCUMENTS

| | | |
|---|---|---|
| 5,540,247 A | 7/1996 | Kawatani et al. |
| 5,850,841 A | 12/1998 | Han et al. |
| 5,875,804 A * | 3/1999 | Tanaka ............ B08B 3/10 134/182 |
| 6,001,216 A | 12/1999 | Lee |
| 6,071,373 A | 6/2000 | Kang et al. |
| 6,256,455 B1 | 7/2001 | Chih |
| 2003/0124853 A1 | 7/2003 | Oi |
| 2004/0140365 A1 | 7/2004 | Izuta |
| 2004/0262265 A1 | 12/2004 | Funabashi et al. |
| 2008/0035182 A1 | 2/2008 | Nakatsukasa et al. |
| 2008/0113454 A1* | 5/2008 | Doni ............ H01L 21/67086 438/694 |
| 2008/0251465 A1 | 10/2008 | Ralph et al. |
| 2009/0087929 A1 | 4/2009 | Yu et al. |
| 2018/0158700 A1 | 6/2018 | Shomori et al. |
| 2018/0218924 A1 | 8/2018 | Tanaka et al. |

FOREIGN PATENT DOCUMENTS

| | | | |
|---|---|---|---|
| JP | H0269939 A | 3/1990 | |
| JP | H0276228 A | 3/1990 | |
| JP | H05102119 A | 4/1993 | |
| JP | H05102121 A * | 4/1993 | |
| JP | 2000-200966 A | 7/2000 | |
| JP | 7515335 B2 * | 7/2024 | |
| KR | 100205543 B1 * | 8/1997 | ....... H01L 21/67057 |

* cited by examiner

WET BENCH AND CHEMICAL TREATMENT METHOD USING THE SAME

PRIORITY CLAIM AND CROSS-REFERENCE

The present application is a Divisional application of the U.S. application Ser. No. 16/457,416, filed Jun. 28, 2019, claims priority to U.S. Provisional Application Ser. No. 62/712,207, filed Jul. 30, 2018, which is herein incorporated by reference in their entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning or processing the substrate and/or the various material layers using lithography to form circuit components and elements thereon and form integrated circuits. Integrated circuits are typically manufactured on a single semiconductor wafer. The individual dies are singulated by sawing the integrated circuits along a scribe line. The individual dies are then packaged separately, in multichip modules, or in other types of packaging, for example.

During the manufacturing of the semiconductor devices, various processing steps are used to fabricate integrated circuits on a semiconductor wafer. For example, semiconductor devices are formed on a semiconductor substrate using several wet chemical processing operations. The wet chemical processing operations may include cleaning operations, stripping operations and etching operations in which the chemicals of a chemical bath react with a material being etched or removed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
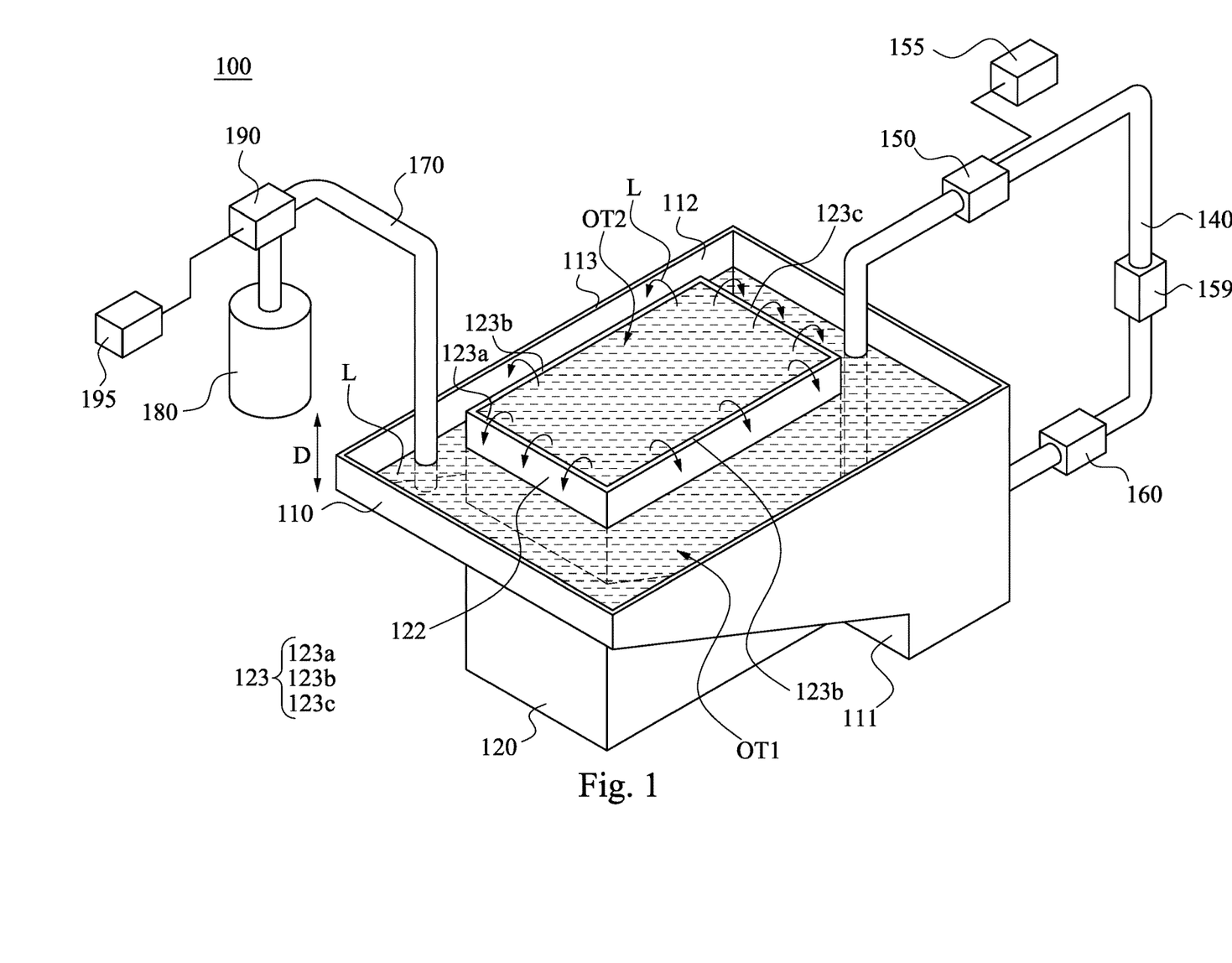
FIG. 1 is a schematic view of a wet bench in accordance with some embodiments of the present disclosure.
Figure 2:
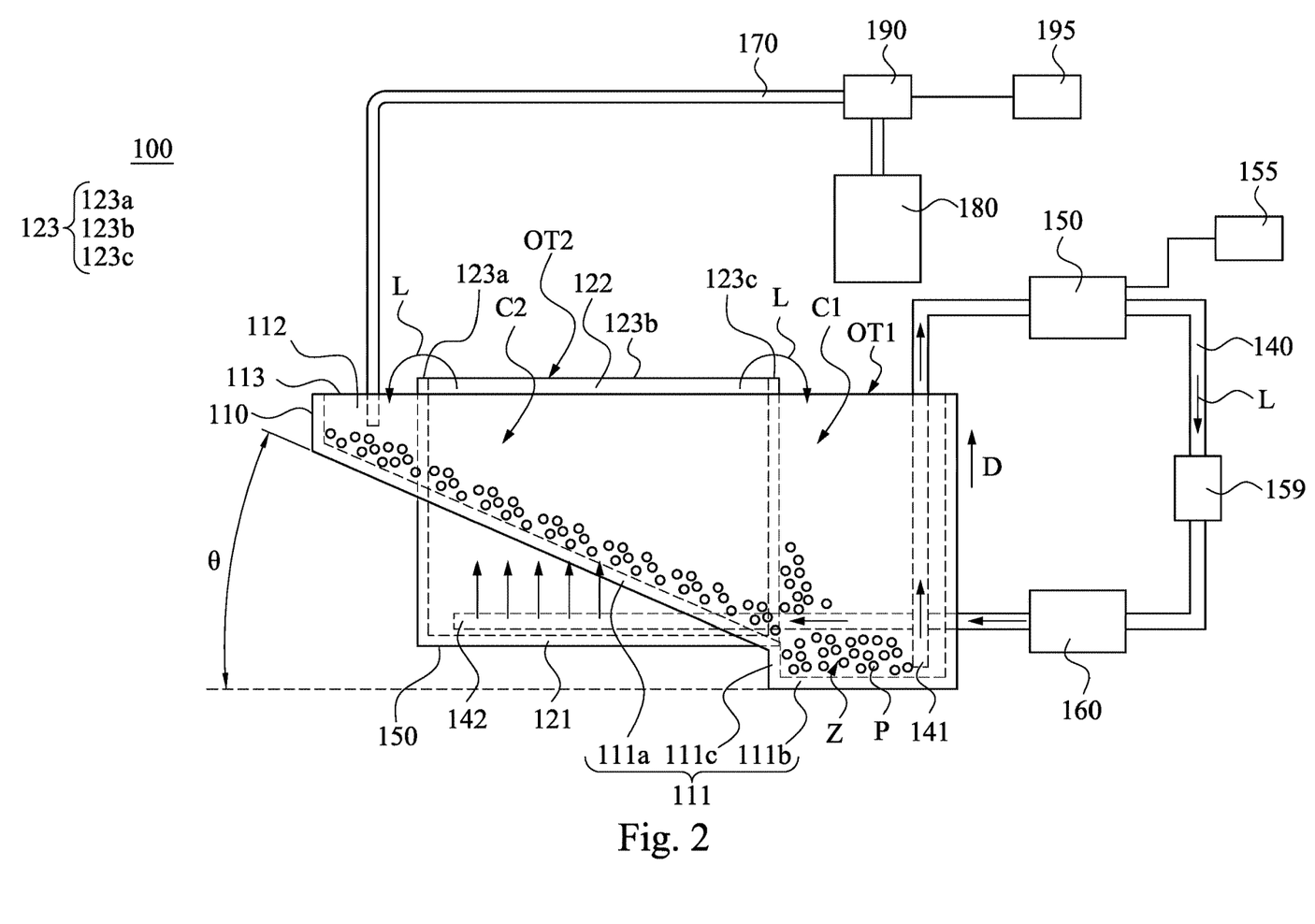
FIG. 2 is a side view of the wet bench of FIG. 1.

Reference is made to FIG. 1 and FIG. 2. FIG. 1 is a schematic view of a wet bench 100 in accordance with some embodiments of the present disclosure, and FIG. 2 is a side view of the wet bench 100 of FIG. 1. In some embodiments, the wet bench 100 includes an outer tank 110 and an inner tank 120. The outer tank 110 has a first base plate 111 and a plurality of first sidewalls 112. The first sidewalls 112 are mutually connected to enclose a perimeter of the first base plate 111, thereby defining a first containing space C1 that has an open top OT1. The inner tank 120 has a second base plate 121 and a plurality of second sidewalls 122. The second sidewalls 122 are mutually connected to enclose a perimeter of the second base plate 121, thereby defining a second containing space C2 that has an open top OT2. The inner tank 120 has a portion accommodated in the first containing space C1, extends through the first base plate 111, and is surrounded by the first sidewalls 112 of the outer tank 120. The second base plate 121 of the inner tank 120 is at least partially external to the outer tank 110. In other words, the second base plate 121 is located outside the outer tank 110. The first base plate 111 has a first portion and a second portion lower than the first portion. In some embodiments, the first portion of the first base plate 111 is elevated higher than the second base plate 121 of the inner tank 120, and the second portion of the first base plate 121 is elevated lower than the second base plate 121 of the inner tank 120. The inner tank 120 is configured to accommodate wafers (not shown) for wet chemical treatments. In some embodiments, a batch/lot of wafers of diameter 200 mm or 300 mm are placed in the second containing space C2 of the inner tank 120 through the open top OT2 for wet chemical treatments. In some embodiments, wafers placed in the second containing space C2 of the inner tank 120 through the open top OT2 have diameters in a range from about 150 mm to 400 mm, in a range from about 150 mm to about 300 mm, or in other ranges.

The second sidewalls 122 of the inner tank 120 are spaced from the first sidewalls 112 of the outer tank 110 at a distance. That is, each of the second sidewalls 122 of the inner tank 120 and the corresponding first sidewall 112 of the outer tank 110 are spaced from each other with a clearing there-between, facilitating a flow path of a chemical liquid L between the second sidewalls 122 of the inner tank 120 and the first sidewalls 112 of the outer tank 110.

During the operation of the wet bench 100, the inner tank 120 is overfilled with the chemical liquid L. Then, the wafers are placed into the inner tank 120 and are immersed in the chemical liquid L, in which the chemical liquid L reacts with the wafers. It is noted that, during operation, the chemical liquid L fills up the inner tank 120 and overflows through the open top OT2 to the outer tank 110. Meanwhile, the chemical liquid L collected by the outer tank 110 flows out of the outer tank 110 and returns to the inner tank 120 through a channel 140 which will be described later. In other words, a recirculation loop of the chemical liquid L is established during the wet chemical treatment to the wafers.

As shown in FIG. 2, the first base plate 111 of the outer tank 110 includes a first subsidiary base plate 111a, an extension plate 111c and a second subsidiary base plate 111b. The first subsidiary base plate 111a is connected to the second subsidiary base plate 111b by the extension plate 111c, and is inclined relative to a horizontal ground. In some embodiments, the extension plate 111c is substantially vertical with respect to the second subsidiary base plate 111b. The first subsidiary base plate 111a is elevated higher than the second subsidiary base plate 111b. The inner tank 120 extends through the first subsidiary base plate 111a, and the first subsidiary base plate 111a is connected to the second sidewalls 122 of the inner tank 120. In some embodiments, the second subsidiary base plate 111b is substantially horizontal. The first subsidiary base plate 111a is also inclined relative to the second subsidiary base plate 111b and the extension plate 111c. The extension plate 111c and the second subsidiary base plate 111b together define a deposit zone Z. As shown in FIG. 2, the deposit zone Z is located above the second subsidiary base plate 111b of the first base plate 111 and adjacent to the extension plate 111c of the first base plate 111. Moreover, the first subsidiary base plate 111a slopes downward toward the deposit zone Z. In other words, the deposit zone Z is located at a lower part of the outer tank 110 and can be understood as a lower portion of the first containing space C1 of the outer tank 110. In some embodiments, a portion of the first subsidiary base plate 110a is elevated higher than the second base plate 121, and the second subsidiary base plate 111b is elevated lower than the second base plate 121.

In some embodiments, the first subsidiary base plate 111a is inclined relative to the second subsidiary base plate 111b substantially at an angle θ. Provided that the second base plate 121 of the inner tank 120 is substantially parallel with the second subsidiary base plate 111b, the first subsidiary base plate 111a is also inclined relative to the second base plate 121 substantially at the angle θ. In some embodiments, the angle θ is in a range from about 15 degrees to about 45 degrees. In some embodiments, the angle θ is in a range from about 15 degrees to about 30 degrees, in a range from about 15 degrees to about 60 degrees, in a range from about 20 degrees to about 40 degrees, or in other ranges.

Furthermore, as shown in FIG. 1 and FIG. 2, each of the second sidewalls 122 has a top edge 123. The top edge 123 is located away from the second base plate 121 along a direction D. On the other hand, each of the first sidewalls 112 has a top edge 113. The top edge 113 is also located away from the second base plate 121 along the direction D. In some embodiments, the top edge 123 of each of the second sidewalls 122 is elevated higher than the top edge 113 of each of the first sidewalls 112. As a result, if the chemical liquid L overflew from the open top OT1 of the outer tank 110, the chemical liquid L would not flow back into the inner tank 120 through the open top OT2 of the inner tank 120. In other words, since the open top OT1 of the outer tank 110 is lower than the open top OT2 of the inner tank 120, the chemical liquid L in the outer tank 120 does not flow into the inner tank 110 through the open top OT1. The overflow of the chemical liquid L from the open top OT2 of the inner tank 120 over the top edges 123 to the outer tank 110 is in a one-way direction.

For the sake of easy explanation, as shown in FIG. 1 and FIG. 2, the top edges 123 of the second sidewalls 122 of the inner tank 120 are further marked as 123a, 123b and 123c. The top edge 123a and the top edge 123c are opposite to each other. The two top edges 123b are opposite to each other and connected between the top edge 123a and the top edge 123c. In some embodiments, the top edges 123a, 123b and 123c form a rectangle.

In some embodiments, the wet bench 100 further includes a channel 140. To be specific, as shown in FIG. 2, the channel 140 penetrates through the second sidewall 122 with the top edge 123c. The channel 140 has an inlet 141 and an outlet portion 142. The inlet 141 and the outlet portion 142 are at opposite ends of the channel 140. The inlet 141 of the channel 140 is arranged inside the first containing space C1 of the outer tank 110 and outside the second containing space C2 of the inner tank 120. In some embodiments, the inlet 141 of the channel 140 is located lower than the second base plate 121. The outlet portion 142 of the channel 140 is inside the second containing space C2 of the inner tank 120. That is, the channel 140 is connected between the first containing space C1 of the outer tank 110 and the second containing space C2 of the inner tank 120. In some embodiments, the channel 140 extends out of the outer tank 110 through the open top OT1, and re-enters the inner tank 120 through the outer tank 110, specifically through one of the first sidewalls 112 of the outer tank 110 and one of the second sidewalls 122 of the inner tank 120.

Moreover, the wet bench 100 further includes a pump 150. The pump 150 is disposed in fluid communication between the inlet 141 and the outlet portion 142. In practical applications, the pump 150 is configured to pump the chemical liquid L, such that the chemical liquid L flows from the inlet 141 located in the first containing space C1 of the outer tank 110 to the outlet portion 142 located in the second containing space C2 of the inner tank 110. In other words, the pump 150 functions to pump the chemical liquid L in the first containing space C1 of the outer tank 110, which is overflown from the inner tank 120 through the open top OT2 over the top edges 123 of the second sidewalls 122, back to the second containing space C2 of the inner tank 120. As a result, a circulation loop of the chemical liquid L between the second containing space C2 of the inner tank 120 and the first containing space C1 of the outer tank 110 is established. In some embodiments, the wet bench 100 further includes a controller 155. The controller 155 is electrically connected with the pump 150 and is configured to control the operation of the pump 150.

To be specific, as shown in FIG. 2, the inlet 141 of the channel 140 is located close to the first base plate 111 of the outer tank 110. To be more specific, the inlet 141 of the channel 140 is located above the second subsidiary base plate 111b and close to the second subsidiary base plate 111b of the first base plate 111. As mentioned above, the deposit zone Z is located above the second subsidiary base plate 111b of the first base plate 111. In other words, the inlet 141 of the channel 140 is substantially located at the deposit zone Z of the outer tank 110. Since the excessive chemical liquid L overflown from the second containing space C2 of the inner tank 120 to the first containing space C1 of the outer tank 110 flows to the deposit zone Z of the outer tank 110 under the action of gravity, the chemical liquid L inside the first containing space C1 of the outer tank 110 can be effectively sucked into the inlet 141 of the channel 140 under the action of the pump 150. In other words, a flow path is established for flowing the chemical liquid L out of the outer tank 110 from the region slightly above the second subsidiary base plate 111b, and the chemical liquid L is then returned to the inner tank 120 through the channel 140. Consequently, the circulation loop of the chemical liquid L between the second containing space C2 of the inner tank 120 and the first containing space C1 of the outer tank 110 is made effective.

In addition, in some embodiments, the wet bench 100 further includes a filter 160. As shown in FIG. 1 and FIG. 2, the filter 160 is in fluid communication with the channel 140 and in fluid communication between the inlet 141 and the outlet portion 142. To be specific, after the chemical liquid L from the deposit zone Z of the outer tank 110 enters into the inlet 141 of the channel 140, the filter 160 filters the chemical liquid L from the inlet 141 of the channel 140, and the filtered chemical liquid L is flown out of the outlet portion 142 of the channel 140 under the action of the pump 150. In some embodiments, the filter 160 is arranged in fluid communication between the pump 150 and the outlet portion 142.

In some embodiments, the wet bench 100 further includes a dampener 159 in fluid communication with the channel 140 and in fluid communication between the inlet 141 and the filter 160. In some embodiments, as shown in FIG. 1 and FIG. 2, the dampener 159 is in fluid communication between the motor 150 and the filter 160. The dampener 159 is configured to dampen the impact of the chemical liquid L flowing in the channel 140 on the filter 160, so as to protect the filter 160 from being damaged by the flow of the chemical liquid L.

On the other hand, as shown in FIG. 1 and FIG. 2, the wet bench 100 further includes a channel 170, a chemical container 180 and a pump 190. The channel 170 is fluidly communicated between the chemical container 180 and the first containing space C1 of the outer tank 120. The chemical container 180 is configured to store a chemical solution which is added into the chemical liquid L. In some embodiments, the chemical solution can be, for instance, ammonium hydroxide ($NH_4OH$), hydrogen peroxide ($H_2O_2$), hydrochloric acid (HCL), hydrofluoric acid (HF) or sulfuric acid ($H_2SO_4$). The pump 190 is in fluid communication with the channel 170 and is configured to pump the chemical solution from the chemical container 180 to the first containing space C1 of the outer tank 120 when the concentration of the chemical solution in the chemical liquid L in the first containing space C1 drops. In some embodiments, the wet bench 100 further includes a controller 195. The controller 195 is electrically connected with the pump 190 and is configured to control the operation of the pump 190.

Figure 3:
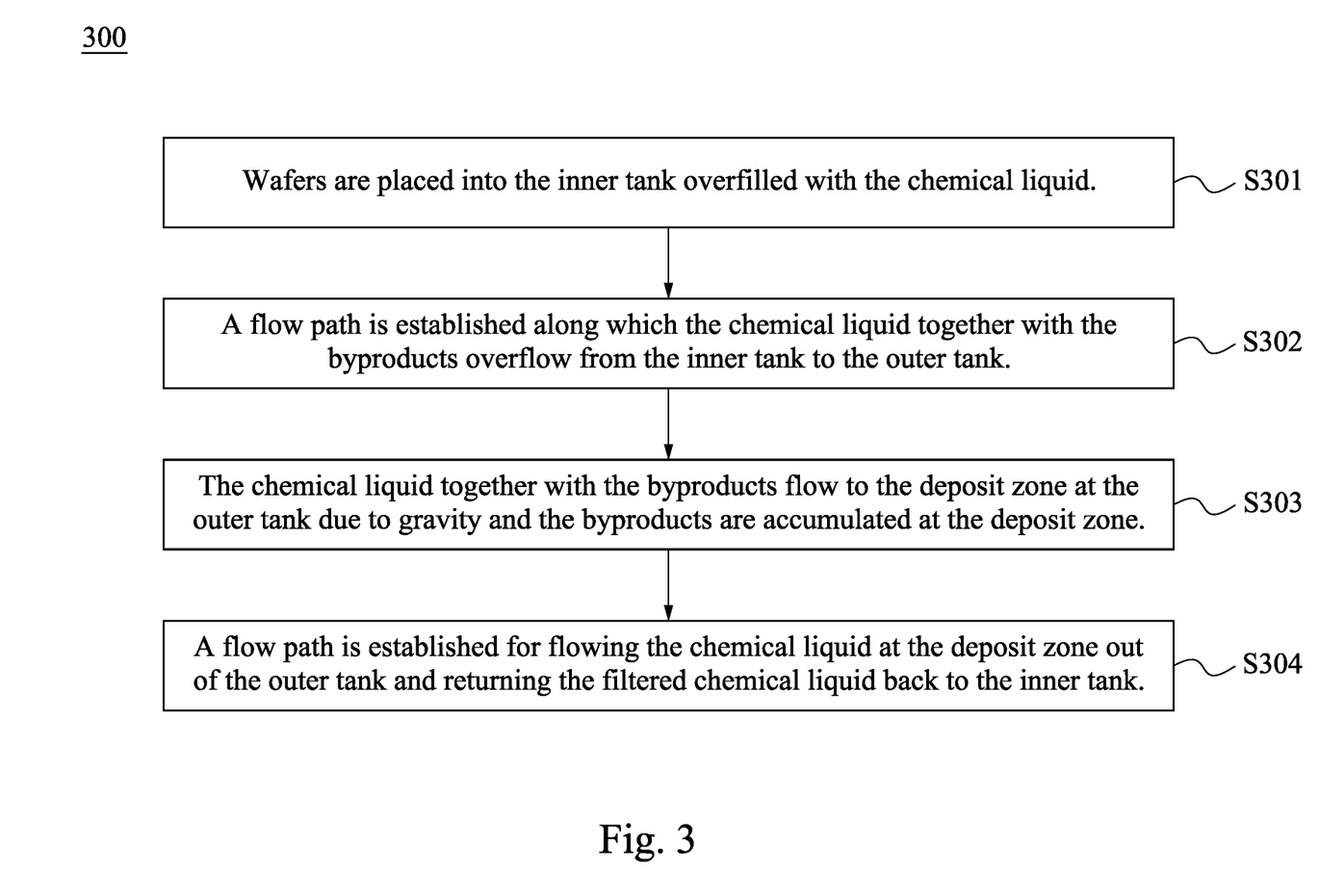
FIG. 3 is a flow chart showing the operational procedure of the wet bench in accordance with some embodiments of the present disclosure.

Reference is made to FIGS. 1, 2, and 3. FIG. 3 is a flow chart showing the operational procedure of the wet bench 100 in accordance with some embodiments of the present disclosure. In some embodiments, as shown in FIG. 3, the method 300 of the wet chemical treatment to the wafers in the wet bench 100 includes the following procedures:

(1) Wafers are placed into the inner tank 120 overfilled with the chemical liquid L (Step S301) such that the chemical reaction to the wafers is carried, and byproducts P are consequently generated.

(2) A flow path is established along which the chemical liquid L together with the byproducts P overflow from the open top OT2 of the inner tank 120 to the outer tank 110 (Step S302).

(3) The chemical liquid L together with the byproducts P flow to the deposit zone Z at the outer tank 110 due to gravity and the byproducts P are accumulated at the deposit zone Z (Step S303).

(4) A flow path is established for flowing the chemical liquid L at the deposit zone Z out of the outer tank 110 and returning the filtered chemical liquid L back to the inner tank 120 (Step S304). In other words, the chemical liquid L is recycled from the deposit zone Z to the inner tank 120.

In detail, during the operation of wet chemical treatment to the wafers in the wet bench 100, the chemical liquid L chemically reacts with the wafers immersed in the second containing space C2 of the inner tank 120 and byproducts P (as shown in FIG. 2) are consequently generated by the chemical reaction. The byproducts P are practically considered unwanted substances which would hinder the chemical reaction of the chemical liquid L with the wafers and thus decrease the operational efficiency of the wet bench 100. When the excessive chemical liquid L overflows from the second containing space C2 of the inner tank 120 through the open top OT2 to the first containing space C1 of the outer tank 110, the byproducts P formed during the wet chemical treatment to the wafers flow together with the chemical liquid L from the second containing space C2 of the inner tank 120 through the open top OT 2 to the first containing space C1 of the outer tank 110. In general, each of the byproducts P has a higher density than the chemical liquid L. In other words, the weight of the byproducts P is heavier than the chemical liquid L, thus the byproducts P sink in the chemical liquid L in the first containing space C1 of the outer tank 110 and approach the first base plate 111.

When the byproducts P generated during the wet chemical treatment to the wafers flow together with the chemical liquid L from the second containing space C2 of the inner tank 120 to the first containing space C1 of the outer tank 110, the byproducts P and the chemical liquid L flow to the space between the second sidewalls 122 of the inner tank 120 and the first sidewalls 112 of the outer tank 110.

As mentioned above, the first base plate 111 of the outer tank 110 includes the first subsidiary base plate 111a and the second subsidiary base plate 111b, and the first subsidiary base plate 111a is inclined relative to the second subsidiary base plate 111b at the angle θ in a range from about 15 degrees to about 45 degrees. Specifically, the first subsidiary base plate 111a slopes downward toward the second subsidiary base plate 111b, the extension plate 111c, and the deposit zone Z. Thus, when the byproducts P and the chemical liquid L overflow and pass over the top edges 123b to the space between the second sidewalls 122 of the inner tank 120 and the first sidewalls 112 of the outer tank 110, the byproducts P and the chemical liquid L flow on the inclined first subsidiary base plate 111a and subsequently approach the deposit zone Z as mentioned above, under the action of gravity. In other words, the byproducts P and the chemical liquid L are guided to flow across the second sidewalls 122 with the top edges 123b towards the deposit zone Z. As mentioned above, the deposit zone Z can be understood as a lower portion of the first containing space C1 of the outer tank 110. In other words, the position of the deposit zone Z is lower than the flow path of the byproducts P and the chemical liquid L across the second sidewalls 122 with the top edges 123b.

Moreover, since the density of the byproducts P is generally greater than the chemical liquid L as mentioned above, the byproducts P flow over the inclined first subsidiary base plate 111a of the first base plate 111 towards the deposit zone Z. Subsequently, the byproducts P are accumulated at the deposit zone Z under the action of gravity.

Furthermore, the byproducts P and the chemical liquid L also flow over the top edge 123a of the second sidewall 122 from the second containing space C2 of the inner tank 120 during the operation of wet chemical treatment to the wafers in the wet bench 100. Thus, the space between the second sidewall 122 with the top edge 123a and the corresponding first sidewall 112 also receives the byproducts P and the chemical liquid L overflowed from the inner tank 120. Since the byproducts P and the chemical liquid L passing over the top edges 123b flow on the inclined first subsidiary base plate 111a to approach the deposit zone Z under the action of gravity as mentioned above, the byproducts P and the chemical liquid L at the space between the second sidewall 122 with the top edge 123a and the corresponding first sidewall 112 then flow to the space between the second sidewalls 122 with the top edges 123b and the corresponding first sidewalls 112 of the outer tank 110, and subsequently flow on the inclined first subsidiary base plate 111a to approach the deposit zone Z. Thus, the byproducts P and the chemical liquid L passing over the top edge 123a of the second sidewall 122 are also accumulated at the deposit zone Z under the action of gravity. If the angle θ is less than about 15 degrees, the effect of gravity on the byproducts P to flow in a downward direction is smaller, and therefore the byproducts P would not be as effectively deposited at the deposit zone Z. If the angle θ is greater than about 45 degrees, in order to maintain sufficient clearance between the second sidewall 122 with the top edge 123a and the corresponding first sidewall 112, the overall height of the outer tank 110 is overly increased, and thereby the volume of the first containing space C1 of the outer tank 110 is thus overly increased. Alternately, if the angle θ is greater than about 45 degrees, in order to maintain a same height of the outer tank 110, the clearance between the second sidewall 122 with the top edge 123a and the corresponding first sidewall 112 is overly decreased, and thereby the flow of the chemical liquid L passing over the top edge 123a into the outer tank 110 may spill out of the outer tank 110 over the corresponding first sidewall 112. If the angle θ is greater than about 45 degrees, the increase in the effectiveness of gravity on the byproducts P to flow toward the deposit zone Z is not sufficient to justify the abovementioned effects of increasing the angle θ.

On the other hand, the byproducts P and the chemical liquid L also flow over the top edge 123c of the second sidewall 122 from the second containing space C2 of the inner tank 120 during the operation of wet chemical treatment to the wafers in the wet bench 100. To be specific, the byproducts P and the chemical liquid L passing over the top edge 123c from the second containing space C2 of the inner tank 120 flow to the space between the second sidewall 122 with the top edge 123c and the corresponding first sidewall 112 of the outer tank 110, which is above the deposit zone Z. Thus, the byproducts P and the chemical liquid L passing over the top edge 123c are also accumulated at the deposit zone Z under the action of gravity.

In summary, during the operation of the wet bench 100, a flow path is established along which the chemical liquid L overflows from the inner tank 120 to the region above the second subsidiary base plate 111b through the region above the first subsidiary base plate 111a of the outer tank 110. Meanwhile, the byproducts P generated by the wet chemical treatment to the wafers passing over the top edges 123a, 123b and 123c of the inner tank 120 and flowing to the outer tank 110 are then accumulated at the deposit zone Z of the outer tank 110 under the action of gravity sequentially through the region above the first subsidiary base plate 111a and the region above the second subsidiary base plate 111b. Moreover, the inner tank 120 and the second sidewalls 122 thereof extend through the first subsidiary base plate 111a. Since the inner tank 120 extends out of the first base plate 111 of the outer tank 110, no portion of the first containing space C1 of the outer tank 110 is between the first base plate 111 of the outer tank 110 and the second base plate 121 of the inner tank 120, and accumulation of the byproducts P between the second base plate 121 of the inner tank 120 and the first base plate 111 of the outer tank 110 is effectively avoided. As a result, the cleaning of the second base plate 121 of the inner tank 120 after the operation becomes easy.

Furthermore, since the first subsidiary base plate 111a is inclined relative to the second subsidiary base plate 111b by the angle θ in a range from about 15 degrees to about 45 degrees as mentioned above, the volume of the first containing space C1 of the outer tank 110 is thus reduced. As a result, the use of chemical liquid L in the first containing space C1 of the outer tank 110 is consequently reduced. In other words, the overall use of chemical liquid L in the wet bench 100 for operation is effectively reduced, and thus the operational cost of the wet bench 100 is correspondingly reduced as well.

To be specific, as mentioned above, the byproducts P generated by the chemical treatment to the wafers passing over the top edges 123a, 123b and 123c of the inner tank 120 and flowing to the outer tank 110 are accumulated at the deposit zone Z of the outer tank 110 under the action of gravity. The inlet 141 of the channel 140 is substantially located among the byproducts P at the deposit zone Z of the outer tank 110. In this way, the byproducts P accumulated at the deposit zone Z is able to flow with the chemical liquid L and enter into the inlet 141 of the channel 140 in an effective manner. Afterwards, the byproducts P entering into the channel 140 are trapped by the filter 160 and the chemical liquid L flowing out of the outlet portion 142 of the channel 140 does not contain the byproducts P. In other words, the chemical liquid L becomes clean when flown back to the inner tank 120 through the filter 160. In this way, the circulation system formed from the pump 150, the filter 160 and the channel 140 works to maintain the cleanness of the chemical liquid L in the inner tank 120 for chemical treatment to the wafers during the operation of the wet bench 100, so as to maintain the efficiency of the wet bench 100 throughout the operation.

Furthermore, as shown in FIG. 2, a portion of the channel 140 with the outlet portion 142 is located close to and substantially parallel to the second base plate 121 of the inner tank 120. Thus, the filtered chemical liquid L flowing out of the outlet portion 142 of the channel 140 under the action of the pump 150 enters the second containing space C2 of the inner tank 120 through the outlet portion 142 arranged close to the bottom of the inner tank 120, and exits the second containing space C2 of the inner tank 120 through the open top OT2 of the second sidewalls 122. In this way, the chemical liquid L in the second containing space C2 of the inner tank 120 can be controlled to flow substantially vertically upwards from the bottom of the inner tank 120, through an entire height of the inner tank 120 before flowing out over the top edges 123 of the second sidewalls 122. Moreover, since the outlet portion 142 of the channel 140 is substantially parallel to the second base plate 121 of the inner tank 120, and spans substantially greater than half the length of the second base plate 121, the flow of the chemical liquid L from the bottom to the top of the inner tank 120 spans a substantial length of the inner tank 120, and is not restricted to a narrow region of the inner tank 120. Therefore, the byproducts P formed during the chemical treatment to the wafers in the second containing space C2 of the inner tank 120 can be effectively delivered away from the second containing space C2 of the inner tank 120. On the other hand, the occurrence of turbulence of the chemical liquid L inside the second containing space C2 of the inner tank 120 is effectively avoided.

Figure 4:
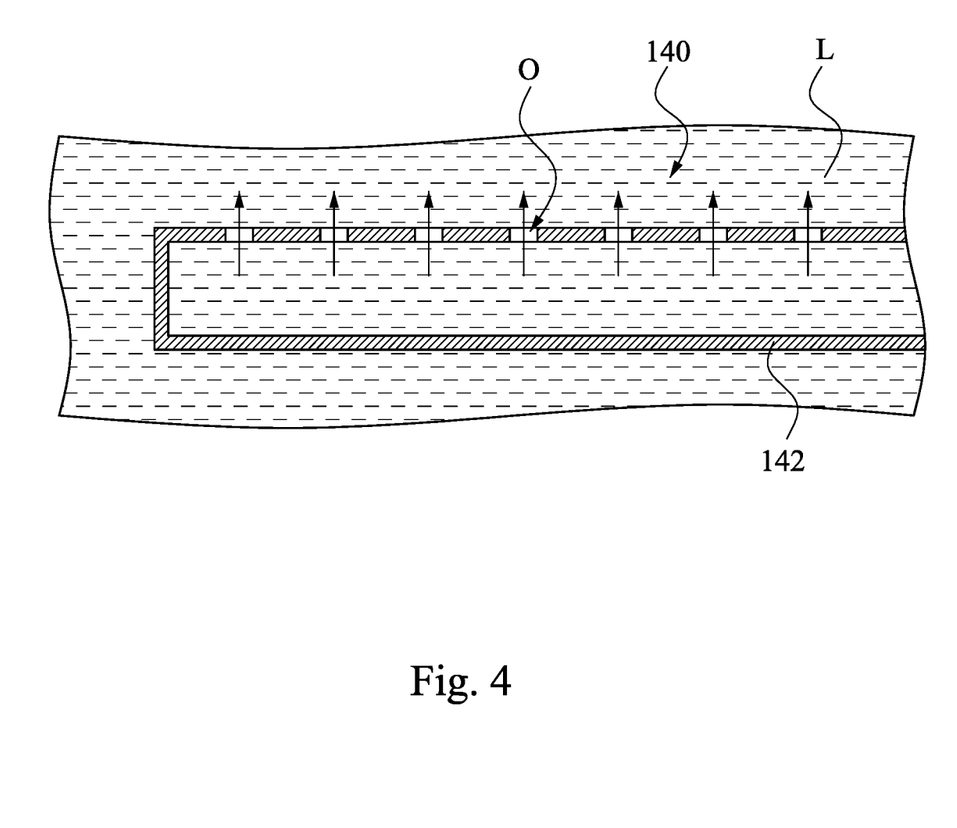
FIG. 4 is a locally magnified view of the outlet portion of the channel of FIG. 2.

Reference is made to FIG. 4. FIG. 4 is a locally magnified view of the outlet portion 142 of the channel 140 of FIG. 2. In some embodiments, as shown in FIG. 4, the outlet portion 142 of the channel 140 has a plurality of outlet holes O. Furthermore, the outlet holes O are distributed along the outlet portion 142 of the channel 140 close to and extending substantially parallel with the second base plate 121. In addition, the outlet holes O face away from the second base plate 121 of the inner tank 120. In other words, the portion of the channel 140 includes a plurality of the outlet holes O facing away from the second base plate 121 of the inner tank 120. In this way, when the filtered chemical liquid L flows out of the outlet holes O of the channel 140 under the action of the pump 150, the filtered chemical liquid L flows upwards in the inner tank 120, facilitating the overflow of excessive chemical liquid L from the second containing space C2 of the inner tank 120 to the first containing space C1 of the outer tank 110. Moreover, the occurrence of turbulence of the chemical liquid L inside the second containing space C2 of the inner tank 120 is effectively avoided. Thus, the circulation of the chemical liquid L between the second containing space C2 of the inner tank 120 and the first containing space C1 of the outer tank 110 is made effective.

In addition, in some embodiments, the pump 150 and the filter 160 are disposed outside the first containing space C1 of the outer tank 110. In other words, the pump 150 and the filter 160 are not immersed in the chemical liquid L. In this way, maintenance or replacement of the pump 150 and the filter 160 become easy and convenient.

In some embodiments, the outer tank 110 and the inner tank 120 include quartz. In practical applications, because of the inert property of quartz, unwanted chemical reaction between the chemical liquid L and the outer tank 110 or the inner tank 120 is effectively avoided. In some other embodiments, the outer tank 110 and the inner tank 120 include a plastic material, because of the same reason as mentioned above.

In summary, since the first subsidiary base plate slopes downward toward the deposit zone, the byproducts generated by the chemical treatment to the wafers pass over the top edges of the inner tank with the chemical liquid, flow to the outer tank, and are accumulated at the deposit zone of the outer tank due to gravity. Moreover, since the first base plate of the outer tank and the second base plate of the inner tank do not overlap, accumulation of the byproducts between the second base plate of the inner tank and the first base plate of the outer tank is effectively avoided. Furthermore, since the first subsidiary base plate is inclined relative to the second subsidiary base plate by the angle in a range from about 15 degrees to about 45 degrees, the volume of the first containing space of the outer tank is thus reduced. As a result, the use of chemical liquid in the first containing space of the outer tank is consequently reduced. In other words, the overall use of chemical liquid in the wet bench for operation is effectively reduced, and thus the operational cost of the wet bench is correspondingly reduced as well.

According to some embodiments, a wet bench includes an outer tank and an inner tank. The outer tank has a first base plate and a plurality of first sidewalls defining a first containing space. A first portion of the first base plate is higher than a second portion of the first base plate. The inner tank has a portion in the first containing space and extends through the first base plate of the outer tank. The inner tank has a second base plate and a plurality of second sidewalls defining a second containing space.

According to some embodiments, a wet bench includes an outer tank and an inner tank. The outer tank has a first base plate. The first base plate has a first portion defining a deposit zone and a second portion slopping downward toward the deposit zone. The inner tank is partially disposed within the outer tank. The inner tank has a second base plate and a plurality of sidewalls, in which the second portion of the first base plate is connected to the sidewalls of the inner tank.

According to some embodiments, a method includes placing a wafer into an inner tank, in which the inner tank is surrounded by an outer tank, a first portion of a bottom of the outer tank is higher than a second portion of the bottom of the outer tank; overfilling the inner tank with a chemical liquid, in which the chemical liquid flows from the inner tank to the outer tank and then flows, through a region above the first portion of the bottom of the outer tank, to a deposit zone above the second portion of the bottom of the outer tank; and recycling the chemical liquid from the deposit zone to the inner tank.

In some embodiments, a method includes introducing a chemical liquid into the inner tank; reacting the wafer with the chemical liquid to generate byproducts; overfilling the inner tank with the chemical liquid and the byproducts from the inner tank to an outer tank, wherein the outer tank has an upper inclined bottom plate, a lower flat bottom plate, and a vertical intermediary bottom plate connecting the upper inclined bottom plate to the lower flat bottom plate, the inner tank penetrates through the upper inclined bottom plate of the outer tank; introducing the chemical liquid with the byproducts from above the lower flat bottom plate of the outer tank to a filter; filtering out the byproducts out of the chemical liquid by using the filter; introducing the filtered chemical liquid to the inner tank. In some embodiments, the upper inclined bottom plate of the outer tank is inclined relative to the lower flat bottom plate of the outer tank substantially at an angle in a range from about 15 degrees to about 45 degrees. In some embodiments, the upper inclined bottom plate of the outer tank is located at a position higher than the lower flat bottom plate of the outer tank. In some embodiments, the outer tank comprises first sidewalls have a topmost position lower than a topmost position of second sidewalls of the inner tank. In some embodiments, the byproducts have a higher density than the chemical liquid. In some embodiments, the method further includes after overfilling the inner tank with the chemical liquid and the byproducts, accumulating the byproducts on the lower flat bottom plate of the outer tank. In some embodiments, introducing the chemical liquid with the byproducts from above the lower flat bottom plate of the outer tank to the filter comprises: pumping the chemical liquid with the byproducts from above the lower flat bottom plate of the outer tank to a position higher than topmost edges of sidewalls of the outer tank; transferring the pumped chemical liquid from the position down to the filter. In some embodiments, introducing the filtered chemical liquid to the inner tank is performed through a fluid channel having outlet holes in the inner tank, wherein the outlet holes are arranged along a straight path above a bottommost position of the upper inclined bottom plate of the outer tank and below a topmost position of the upper inclined bottom plate of the outer tank, and the straight path crosses the upper inclined bottom plate of the outer tank when viewed in a side view. In some embodiments, introducing the chemical liquid with the byproducts is performed through an upstream pipe of a fluid channel having an inlet above the lower flat bottom plate of the outer tank, introducing the filtered chemical liquid to the inner tank is performed through a downstream pipe of the fluid channel having an outlet in the inner tank, and the downstream pipe of the fluid channel horizontally extends across the upstream pipe and forms a cross-shaped pattern with the upstream pipe in the outer tank when viewed in a side view. In some embodiments, the method further includes dampening the chemical liquid during introducing the chemical liquid with the byproducts from above the lower flat bottom plate of the outer tank to the filter.

In some embodiments, a method includes immersing a wafer in a chemical liquid within an inner tank; performing a wet chemical treatment on the wafer with the chemical liquid; guiding the chemical liquid from the inner tank to flow across first sidewalls of the inner tank to an outer tank, wherein the outer tank has an upper inclined bottom plate, a lower flat bottom plate, and a vertical intermediary bottom plate connecting the upper inclined bottom plate to the lower flat bottom plate, the inner tank penetrates through the upper inclined bottom plate of the outer tank; introducing the chemical liquid from above the lower flat bottom plate of the outer tank to a filter; introducing the chemical liquid from the filter to the inner tank through a fluid channel having outlet holes in the inner tank, wherein the outlet holes are arranged along a straight path above a bottommost position of the upper inclined bottom plate and below a topmost position of the upper inclined bottom plate, and the straight path crosses the upper inclined bottom plate when viewed in a side view. In some embodiments, the upper inclined bottom plate of the outer tank is inclined relative to the lower flat bottom plate of the outer tank substantially at an angle in a range from about 15 degrees to about 45 degrees. In some embodiments, the fluid channel laterally extends from the filter through one of second sidewalls of the outer tank and then through one of the first sidewalls of the inner tank to the outlet holes in the inner tank. In some embodiments, the chemical liquid comprises ammonium hydroxide, hydrogen peroxide, hydrochloric acid, hydrofluoric acid, sulfuric acid, or combinations thereof. In some embodiments, the wet chemical treatment is performed to generate byproducts from the wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    placing a wafer into an inner tank;
    introducing a chemical liquid into the inner tank;
    reacting the wafer with the chemical liquid to generate byproducts;
    overfilling the inner tank with the chemical liquid and the byproducts from the inner tank to an outer tank, wherein the outer tank has an upper inclined bottom plate, a lower flat bottom plate, and a vertical intermediary bottom plate connecting the upper inclined bottom plate to the lower flat bottom plate, the inner tank penetrates through the upper inclined bottom plate of the outer tank, and the lower flat bottom plate is lower than a bottom of the inner tank;
    introducing the chemical liquid with the byproducts from above the lower flat bottom plate of the outer tank to a filter;
    filtering the byproducts out of the chemical liquid by using the filter; and
    introducing the filtered chemical liquid to the inner tank.

2. The method of claim 1, wherein the upper inclined bottom plate of the outer tank is inclined relative to the lower flat bottom plate of the outer tank substantially at an angle in a range from about 15 degrees to about 45 degrees.

3. The method of claim 1, wherein the upper inclined bottom plate of the outer tank is located at a position higher than the lower flat bottom plate of the outer tank.

4. The method of claim 1, wherein the outer tank comprises first sidewalls have a topmost position lower than a topmost position of second sidewalls of the inner tank.

5. The method of claim 1, wherein the byproducts have a higher density than the chemical liquid.

6. The method of claim 1, further comprising:
    after overfilling the inner tank with the chemical liquid and the byproducts, accumulating the byproducts on the lower flat bottom plate of the outer tank.

7. The method of claim 1, wherein introducing the chemical liquid with the byproducts from above the lower flat bottom plate of the outer tank to the filter comprises:
    pumping the chemical liquid with the byproducts from above the lower flat bottom plate of the outer tank to a position higher than topmost edges of sidewalls of the outer tank; and
    transferring the pumped chemical liquid from the position down to the filter.

8. The method of claim 1, wherein introducing the filtered chemical liquid to the inner tank is performed through a fluid channel having outlet holes in the inner tank, wherein the outlet holes are arranged along a straight path above a bottommost position of the upper inclined bottom plate of the outer tank and below a topmost position of the upper inclined bottom plate of the outer tank, and the straight path crosses the upper inclined bottom plate of the outer tank when viewed in a side view.

9. The method of claim 1, wherein introducing the chemical liquid with the byproducts is performed through an upstream pipe of a fluid channel having an inlet above the lower flat bottom plate of the outer tank, introducing the filtered chemical liquid to the inner tank is performed through a downstream pipe of the fluid channel having an outlet in the inner tank, and the downstream pipe of the fluid channel horizontally extends across the upstream pipe and forms a cross-shaped pattern with the upstream pipe in the outer tank when viewed in a side view.

10. The method of claim 1, further comprising:
dampening the chemical liquid during introducing the chemical liquid with the byproducts from above the lower flat bottom plate of the outer tank to the filter.

11. A method, comprising:
immersing a wafer in a chemical liquid within an inner tank;
performing a wet chemical treatment on the wafer with the chemical liquid;
guiding the chemical liquid from the inner tank to flow across first sidewalls of the inner tank to an outer tank, wherein the outer tank has an upper inclined bottom plate, a lower flat bottom plate, and a vertical intermediary bottom plate connecting a bottommost end of the upper inclined bottom plate to the lower flat bottom plate, the inner tank penetrates through the upper inclined bottom plate of the outer tank;
introducing the chemical liquid from above the lower flat bottom plate of the outer tank to a filter through a first fluid channel, wherein an inlet of the first fluid channel is lower than the bottommost end of the upper inclined bottom plate; and
introducing the chemical liquid from the filter to the inner tank through a second fluid channel having outlet holes in the inner tank, wherein the outlet holes are arranged along a straight path above a bottommost position of the upper inclined bottom plate and below a topmost position of the upper inclined bottom plate, and the straight path crosses the upper inclined bottom plate when viewed in a side view.

12. The method of claim 11, wherein the upper inclined bottom plate of the outer tank is inclined relative to the lower flat bottom plate of the outer tank substantially at an angle in a range from about 15 degrees to about 45 degrees.

13. The method of claim 11, wherein the second fluid channel laterally extends from the filter through one of second sidewalls of the outer tank and then through one of the first sidewalls of the inner tank to the outlet holes in the inner tank.

14. The method of claim 11, wherein the chemical liquid comprises ammonium hydroxide, hydrogen peroxide, hydrochloric acid, hydrofluoric acid, sulfuric acid, or combinations thereof.

15. The method of claim 11, wherein the wet chemical treatment is performed to generate byproducts from the wafer.

16. A method, comprising:
placing a wafer into an inner tank, wherein the inner tank is surrounded by an outer tank, a first portion of a bottom of the outer tank is higher than a second portion of the bottom of the outer tank;
overfilling the inner tank with a chemical liquid, wherein the chemical liquid flows from the inner tank to the outer tank and then flows, through a region above the first portion of the bottom of the outer tank, to a deposit zone above the second portion of the bottom of the outer tank; and
recycling the chemical liquid from the deposit zone to the inner tank through a fluid channel, wherein an inlet of the fluid channel is in the deposit zone and lower than a bottom of the inner tank.

17. The method of claim 16, wherein recycling the chemical liquid comprises:
filtering the chemical liquid.

18. The method of claim 16, wherein the first portion of the bottom of the outer tank slopes downward toward the deposit zone.

19. The method of claim 18, wherein the first portion of the bottom of the outer tank is inclined relative to the second portion of the bottom of the outer tank substantially at an angle in a range from about 15 degrees to about 45 degrees.

20. The method of claim 16, wherein the fluid channel has outlet holes in the inner tank, and the outlet holes are arranged along a straight path above a bottommost position of the first portion of the bottom of the outer tank and below a topmost position of the first portion of the bottom of the outer tank, and the straight path crossing the first portion of the bottom of the outer tank when viewed in a side view.

* * * * *